(12) United States Patent
Dirscherl et al.

(10) Patent No.: US 7,333,358 B2
(45) Date of Patent: Feb. 19, 2008

(54) MEMORY ELEMENT

(75) Inventors: Gerd Dirscherl, Munich (DE); Roth Manfred, Munich (DE)

(73) Assignee: Infineon Technologies AG (DE)

( * ) Notice: Subject to any disclaimer, the term of this patent is extended or adjusted under 35 U.S.C. 154(b) by 0 days.

(21) Appl. No.: 11/465,209

(22) Filed: Aug. 17, 2006

(65) Prior Publication Data

US 2007/0041241 A1    Feb. 22, 2007

(30) Foreign Application Priority Data

Aug. 17, 2005  (DE)  ............... 10 2005 038 938

(51) Int. Cl.
*G11C 11/00*    (2006.01)
(52) U.S. Cl. ............... 365/154; 365/156; 365/203
(58) Field of Classification Search ............... 365/154, 365/156, 203
See application file for complete search history.

(56) References Cited

U.S. PATENT DOCUMENTS 6,333,877 B1 * 12/2001 Nagaoka et al. ............ 365/200
7,224,594 B2 * 5/2007 Behrends et al. ............ 365/49
2006/0120127 A1 * 6/2006 Murakami et al. ............ 365/49

FOREIGN PATENT DOCUMENTS

EP    1 025 564 B1    10/1998
EP    1 164 594 A1    12/2001

* cited by examiner

*Primary Examiner*—Anh Phung
*Assistant Examiner*—Toan Le
(74) *Attorney, Agent, or Firm*—Dickstein, Shapiro, LLP.

(57) ABSTRACT

A memory element having a first and second logic components, each having a first input, a second input, and an output. The first input of each of the logic components is connected to the output of the other logic component. The second inputs of each of the logic components are connected to a control line. The first and second logic components are embodied such that when a control signal having a first level is applied to the control line at the respective output, a signal is output which has an output level that is inverted with respect to the level of the signal present at the respective first input, and when a control signal having a second level is applied to the control line at the respective output, a signal is output which has a predetermined level independent of the level of the signal present at the respective first input.

21 Claims, 2 Drawing Sheets

MEMORY ELEMENT

CROSS-REFERENCE TO RELATED APPLICATION

This application claims priority to German Patent Application Serial No. 102005038938.4, which was filed on Aug. 17, 2005, and is incorporated herein by reference in its entirety.

FIELD OF THE INVENTION

The invention relates to a memory element, in particular a memory element having two feedback logic components for use in dual rail precharged circuits.

BACKGROUND OF THE INVENTION

Memory elements are necessary constituent parts of digital systems alongside the logic circuits. A distinction is made between RAM memories, which enable both write and read accesses, and ROM memories, in which only read accesses are possible. RAM memories can be subdivided into static RAMs (SRAM), in which the memory function is realized by a flip-flop or a bistable circuit with nonlinear feedback, and dynamic RAMs (DRAM) in which the information is stored as a quantity of charge on a capacitor.

FIG. 1 shows a detail having four memory elements SE from the cell array of an SRAM. A memory element SE is required for each bit, the memory element comprising two feedback inverters I. The memory elements SE are each connected to a horizontally running word line WL and two vertically running bit lines BL1 and BL2. A row of memory elements SE can be selected by a word line potential VWL being applied to one of the word lines WL. The memory elements SE of the selected row are linked to the corresponding bit lines BL1 and BL2 via selection transistors T, the control inputs of which are driven by the word line WL. For reading the content of a memory element SE, a sense amplifier is connected to the bit lines BL1 and BL2, while for writing purposes the bit lines BL1 and BL2 are connected to a driver. The use of complementary levels at the bit lines BL1 and BL2 makes it possible to increase the reliability and reduce the sensitivity to fluctuations in the component sizes. The bit lines BL1 and BL2 can be precharged to a precharge potential VP in a precharge unit VE by means of precharge transistors TV. For this purpose, a precharge signal PC having a high level must be present at the control inputs of the precharge transistors TV. The read and write operations can be shortened as a result of the precharging of the bit lines BL1 and BL2. At a precharge potential VP=VDD/2, where VDD is the supply potential, only a voltage swing of VDD/2 occurs upon charge reversal to VDD or GND at each bit line BL1 and BL2, whereby the quantity of charge that is to be subjected to charge reversal and thus the required time are reduced.

SRAM memories are also used in the integrated circuits arranged in smart cards. The information stored in the smart cards, which is generally not freely accessible, serves for authorization and identification, for example when managing an account. It is not surprising, therefore, that smart cards are subject to attacks with the intention of covertly observing this information. One of the most important methods of attack is differential power analysis (DPA). In the course of a DPA, the current consumption of a smart card is measured over one or more clock cycles, a model is created and statistical methods are used in an attempt to draw conclusions about the stored information from the correlation of systematic data variations and current consumption.

Since smart cards have small dimensions, conventional defense measures against DPA, such as, for example, shielding and large capacitors which minimize variations in the current consumption, cannot be employed. For protection against a DPA, therefore, recourse is had to so-called dual rail precharged circuit technology. Dual rail means that each node in the circuit is assigned a second node having a complementary level with respect to the level of the first node. Signals are simultaneously transmitted and processed on both nodes. The logic value 0 is assigned the complementary value 1 and the pair (0, 1) is obtained; the value 1 is assigned the complementary value 0 and the pair (1, 0) is obtained. If the data paths for both nodes are embodied physically identically, then it is no longer possible to identify by means of a DPA whether a 1 or a 0 has been transmitted or processed, since the complementary value has been concomitantly transmitted in both cases. Thus, independently of the level or state, exactly a 1 and a 0 are always transmitted or processed.

For protection against a DPA, it must also not be possible to be able to distinguish the four possible transitions of the signal states 0→0, 0→1, 1→0, 1→1 on the basis of the current consumption. If a state does not change, as for example in the case of the transitions 0→0 and 1→1, no current would flow in the case of a CMOS realization, but current would flow in the case of the transitions 0→1 and 1→0. In order that all transitions have the same current consumption, a so-called precharge state is inserted prior to each transition. In the precharge state, the node and its assigned node have the same levels. Depending on whether a precharge to high or low is effected, the logically invalid intermediate states (1, 1) or (0, 0) arise. In each of the four possible transitions, as a result of the precharge, only exactly one of the nodes is charged and the other node is discharged. Therefore, the transitions can no longer be distinguished on the basis of their current consumption and are consequently safeguarded against a DPA.

Conventional SRAM cells are already designed using dual rail precharged circuit technology for design-related reasons in the case of read accesses. The first storage node X and the second storage node Y in each memory element SE have mutually complementary levels. Independently of the value stored in the memory element SE, one of the storage nodes X or Y always has a low level and the other a high level, which is also evident from the fact that the storage nodes X and Y are in each case connected to one another via an inverter I.

The first bit line BL1 and the second bit line BL2 also have mutually complementary levels if they are not actually precharged to the precharge potential VP by the precharge transistors TV. In the event of reading the memory elements SE, the first bit line BL1 and the second bit line BL2 are connected to the first storage node X and the second storage node Y, respectively, by the selection transistors T. The mutually complementary levels at the first storage node X and the second storage node Y are thus forwarded to the first bit line BL1 and the second bit line BL2, so that these also have mutually complementary levels.

Between the read accesses, the first bit line BL1 and the second bit line BL2 are precharged to the potential VP=VDD/2 by the precharge unit VE. It will now be assumed that a high level corresponds to the supply potential VDD and a low level corresponds to the ground potential GND=0 V. If the first storage node X has a high level and the second storage node Y has a low level, then during reading the first bit line BL1 is charged from VDD/2 to VDD, which means a voltage change of +VDD/2. At the same time, the second bit line BL2 is discharged from VDD/2 to 0 volts, which represents a voltage difference of −VDD/2. Given an identical physical realization of the first bit line BL1 and of the second bit line BL2, the same quantity of charge in each case flows for charging and discharging, so that overall a vanishing charge integral results. If, by contrast, the first storage node X has a low level and the second storage node Y has a high level, then the polarities of the voltage swings are interchanged, but the charge integral is zero again. During reading, therefore, it is not possible to ascertain whether a high level or a low level is stored or read out. Therefore, the stored information cannot be analyzed by means of current profiles, so that a conventional SRAM cell is already safeguarded against a DPA during reading.

When writing to a conventional SRAM cell, the first bit line BL1 and the second bit line BL2 to which the memory element SE to be read is connected are selected and connected to a bit line driver. In this case, the first bit line BL1 has a complementary level with respect to the second bit line BL2. If a word line potential VWL is applied to the word line WL which is connected to the control inputs of the selection transistors T of the memory element SE to be written to, then the first storage node X is connected to the first bit line BL1 and the second storage node Y is connected to the second bit line BL2. The first storage node X and the second storage node Y then likewise have mutually complementary levels.

In contrast to the read operation, during writing the charge integral depends on the state stored in the memory element SE and the state to be written. If the first storage node X and the second storage node Y already have the potentials of the first bit line BL1 and the second bit line BL2, then no shunt current flows through the memory element SE. However, if the level of the storage nodes X and Y is to be changed by application of corresponding levels to the first bit line BL1 and the second bit line BL2, then a shunt current flows through the memory element SE as a result of a simultaneous change in the levels of the storage nodes X and Y. The shunt current is particularly pronounced if the inverters I are embodied using CMOS technology. Since different currents flow depending on the stored value and the value to be written, it is possible, in principle, to specify a relationship concerning the memory content and the data to be written on the basis of an analysis of the current profile.

SUMMARY OF THE INVENTION

The invention specifies a memory element which is safeguarded with respect to a DPA both in the event of reading and in the event of writing. On account of the greatly limited chip area, a memory element of this type is intended to be able to be realized as simply as possible.

The invention is achieved by means of a memory element, having a first logic component and a second logic component, each logic component having a first input, a second input and an output. The first input of the first logic component is connected to the output of the second logic component and the first input of the second logic component is connected to the output of the first logic component. The second input of the first logic component and the second input of the second logic component are connected to a control line. The first logic component and the second logic component are embodied in such a way that when a control signal having a first level is applied to the control line at the respective output a signal is output which has an output level that is inverted with respect to the level of the signal present at the respective first input, and when a control signal having a second level is applied to the control line at the respective output a signal is output which has a predetermined level independent of the level of the signal present at the respective first input.

In an advantageous manner, when a control signal having a second level is present at the control line the predetermined level corresponds to the first level.

In an advantageous manner, when a control signal having a second level is present at the control line, the predetermined level corresponds to the second level.

In an advantageous manner, the first level is complementary to the second level.

In an advantageous manner, the first logic component and the second logic component are NOR gates.

In an advantageous manner, the first level is a low level and the second level is a high level.

In an advantageous manner, the first logic component and the second logic component are NAND gates.

In an advantageous manner, the first level is a high level and the second level is a low level.

In an advantageous manner, the first input of the first logic component and the output of the second logic component are connected to a first bit line via a first selection transistor, the first input of the second logic component and the output of the first logic component are connected to a second bit line via a second selection transistor, and the control input of the first selection transistor and the control input of the second selection transistor are connected to a word line.

The invention is furthermore achieved by means of a method for storing information in the memory element described above and comprises the steps of: precharging the output of the first logic component and the output of the second logic component to a predetermined level, and storing information in the memory element.

In an advantageous manner, the step of precharging the outputs comprises applying a signal having a second level to the control line.

In an advantageous manner, the step of storing information comprises the following steps of: applying a signal having a write level to the first bit line and applying a signal having a complementary level with respect to the write level to the second bit line, the write level and the complementary level with respect thereto corresponding to the information to be stored in the memory element, applying a signal having a first level to the control line, and applying a signal having a word line potential to the word line.

In an advantageous manner, the word line potential is chosen such that the first input of the first logic component and the output of the second logic component are connected to the first bit line via the first selection transistor and the first input of the second logic component and the output of the first logic component are connected to the second bit line via the second selection transistor.

In an advantageous manner, the first level is complementary to the second level.

In an advantageous manner, the application of a signal having a first level to the control line and the application of a signal having a word line potential to the word line are effected simultaneously.

In an advantageous manner, if the first logic component and the second logic component are NOR gates the first level is a low level and the second level is a high level.

In an advantageous manner, if the first logic component and the second logic component are NAND gates the first level is a high level and the second level is a low level.

BRIEF DESCRIPTION OF THE DRAWINGS

The invention is explained in more detail below using exemplary embodiments with reference to drawings.

DETAILED DESCRIPTION OF PREFERRED EMBODIMENTS OF THE INVENTION

Figure 2:
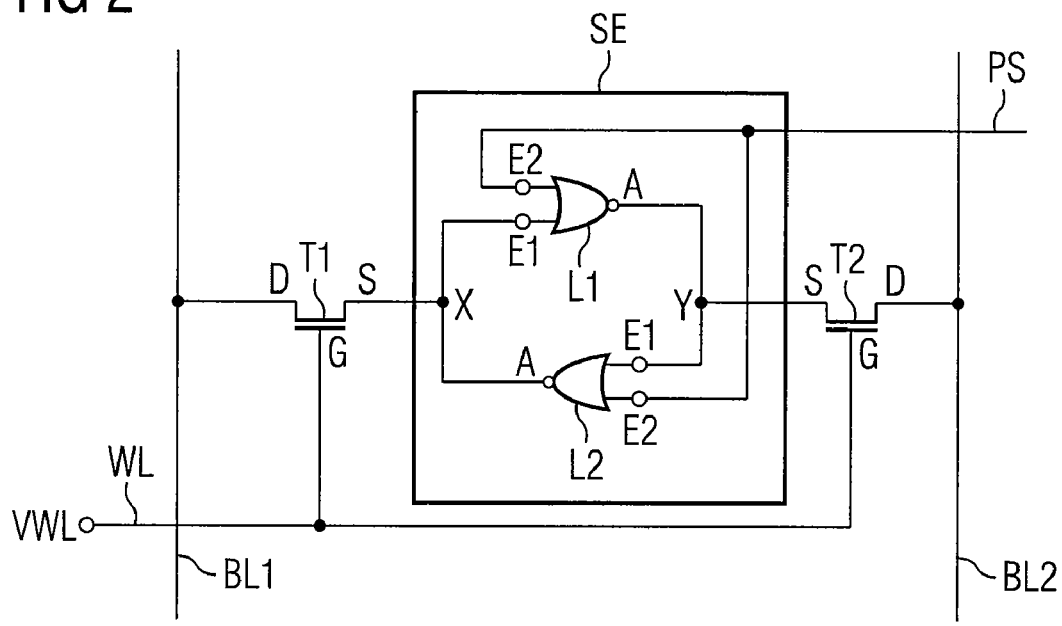
FIG. 2 shows a first exemplary embodiment of the memory element according to the invention with NOR gates.

FIG. 2 shows a first exemplary embodiment of the memory element SE according to the invention. The first logic component L1 and the second logic component L2 are NOR gates and in each case have a first input E1, a second input E2 and an output A. The first input E1 of the NOR gate L1 is connected to the output A of the second NOR gate L2. The first input E1 of the second NOR gate L2 is connected to the output A of the first NOR gate L1. The second inputs E2 are connected to a control line PS, to which signals having a first level P1 and a second level P2 can be applied. The information stored in the memory element SE is gathered from the levels of the first storage node X and the second storage node Y, which are connected to the output A of the second NOR gate L2 and the output A of the first NOR gate L1, respectively. The first storage node X can be connected to a first bit line BL1 via a first selection transistor T1, and the second storage node Y can be connected to a second bit line BL2 via a second selection transistor T2. The control inputs G of the selection transistors T1 and T2 are connected to a word line WL, to which a signal having a word line potential VWL can be applied.

Depending on the level present at the control line PS, the memory element SE is operated either in a storage mode or a precharge mode. When a first level P1, chosen here as a low level, is applied to the control line PS, the memory element SE behaves like a conventional SRAM cell. The second inputs E2 of the NOR gates L1 and L2 then have low levels, so that the NOR gates L1 and L2 operate as inverters. The outputs A have a complementary or inverted output level P3 with respect to the first input E1. The desired storage function is obtained by means of the feedback connection from the outputs A to the first inputs E1. The first and second storage nodes X and Y have mutually complementary levels on account of the inversion. In dual rail notation, therefore, the pairs (1, 0) or (0, 1) are stored.

When a second level P2, chosen here as a high level, is applied to the control line PS, the first and second storage nodes X and Y are precharged to a predetermined level P4. The second inputs E2 then have a high level, so that the outputs A of the two NOR gates L1 and L2 always have a predetermined level P4, independently of the levels present at the first inputs E1. The outputs A are therefore decoupled from the associated first inputs E1 in the NOR gates L1 and L2, so that the first and second storage nodes X and Y can be precharged to the same predetermined level P4. The predetermined level P4 is a low level in the case of a NOR gate. In dual rail notation, the precharged first and second storage nodes X and Y are described by the pair (0, 0).

The reading of information from the memory element SE shown in FIG. 2 takes place essentially as in the prior art but the first level P1, that is to say a low level, must be present at the control line PS, and so a repetition of the description is dispensed with here.

The writing of information to the memory element SE takes place in two steps. In the first step, the first and second storage nodes X and Y are precharged to a predetermined level P4. For this purpose, a second level P2, which is a high level, is applied to the control line PS. The first and second storage nodes X and Y thereupon have a predetermined level P4, which is a low level in the case of NOR gates so that the state (0, 0) is stored in the memory element SE.

The second step of the write operation consists in the write level present at the first bit line BL1 being forwarded to the first storage node X and the write level present at the second bit line BL2 being forwarded to the second storage node Y. If, by way of example, a low level is intended to be stored in the first storage node X, then a low level is to be applied to the first bit line BL1 and, complementarily with respect thereto, a high level is to be applied to the second bit line BL2. Afterward, a first level P1 corresponding to a low level is applied to the control line PS and a word line potential VWL is applied to the word line WL. The memory element SE is switched into the storage mode as a result of the low level at the control line PS. As a result of the application—which may be effected simultaneously therewith—of a word line potential VWL having a high level, the first and second selection transistors T1 and T2 turn on, so that the first storage node X is connected to the first bit line BL1 and the second storage node Y is connected to the second bit line BL2. Mutually complementary levels at the first bit line BL1 and at the second bit line BL2 are thus transmitted to the first and second storage nodes X and Y, so that the memory element SE has, in dual rail notation, either the state (1, 0) or (0, 1).

As a result of the precharging of the storage nodes X and Y it is no longer possible to distinguish whether the state to be stored corresponds to the stored state or whether the state to be stored differs from the state already stored in the memory element SE. This is because in both cases firstly both storage nodes X and Y are precharged with a low level and, during subsequent writing, independently of the state to be stored, precisely one of the two storage nodes X or Y is always charged to a high level. The associated transitions in dual rail notation are (0, 0)→(0, 1) or (0, 0)→(1, 0).

In order subsequently to attain the precharge state from a stored state, it is necessary, independently of the stored state, for precisely one of the storage nodes X or Y always to be discharged to a low level. The associated transitions in dual rail notation are (0, 1)→(0, 0) or (1, 0)→(0, 0). On account of the symmetry of the circuit, therefore, the same current always flows independently of the stored state and independently of the state to be stored, both during precharging and during writing. The SRAM cell shown in FIG. 2 is thus safeguarded against a DPA during writing as well.

Figure 3:
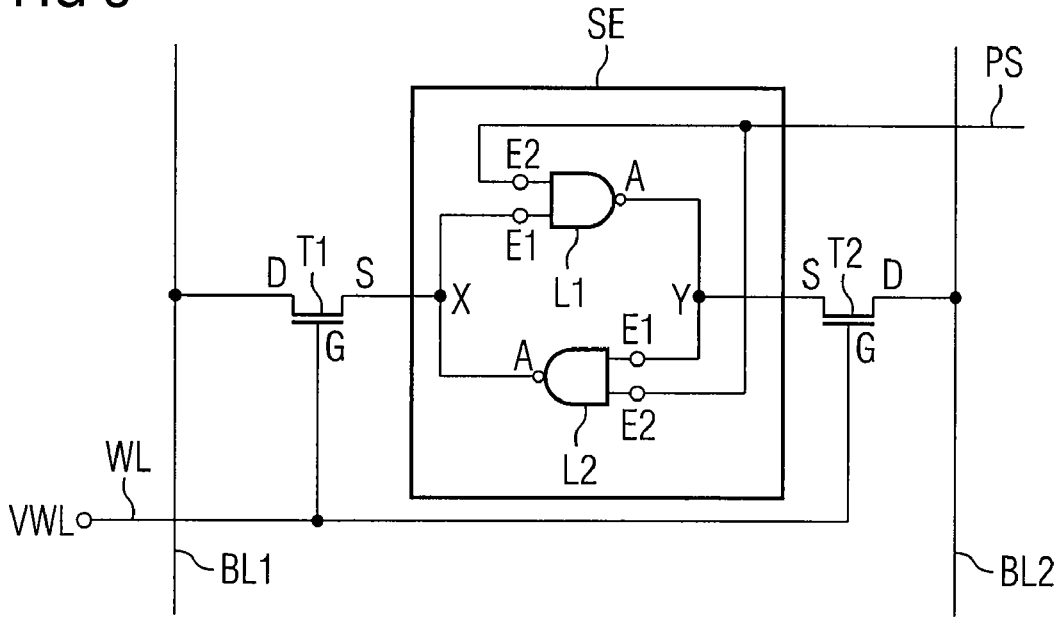
FIG. 3 shows a second exemplary embodiment of the memory element according to the invention with NAND gates.

FIG. 3 shows an exemplary embodiment of the memory element SE in which the first and second logic components L1 and L2 are realized as NAND gates. The description of the construction, of the function and of the write operation essentially corresponds to the arrangement described in FIG. 2, with the differences described below.

In the storage mode, a first level P1 that is a high level is applied to the control line PS. The second inputs E2 of the NAND gates L1 and L2 thus have high levels, so that the two NAND gates L1 and L2 operate as inverters with respect to the first inputs E1. In this operating mode, the memory element SE operates like a conventional memory element.

In the precharge mode, a second level P2 corresponding to a low level is applied to the control line PS. The second inputs E2 of the NAND gates L1 and L2 then have a low level, so that the outputs A of the two NAND gates L1 and L2 have a predetermined level P4 corresponding to a high level. Independently of the level at the first inputs E1, the outputs A thus have high levels. The first and second storage nodes X and Y are both thereby precharged to a high level, which is represented by the state (1, 1) in dual rail notation.

The description of the read method and of the write method of the arrangement shown in FIG. 3 corresponds to the arrangement shown in FIG. 2, but the first level P1 is a high level and the second level P2 is a low level and precharge is effected to a high level. The transitions take place from (1, 1)→(0, 1) or from (1, 1)→(1, 0). During precharging of the storage nodes X and Y, precisely one of the storage nodes X or Y is always charged to a high level, while during writing precisely one of the storage nodes X or Y is always discharged to a low level. The transitions take place from (1, 0)→(1, 1) or from (0, 1)→(1, 1). The circuit shown in FIG. 3, too, is thus safeguarded against a DPA during writing.

The realization of the logic components by means of NAND or NOR gates is particularly simple. However, the first logic component L1 and the second logic component L2 may also be realized with different components than the NOR and NAND gates shown. It is conceivable, by way of example, for them to be in the storage mode when there is a low level at the control line PS and in a precharge mode when there is a high level at the control line PS, in a similar manner to the realization with NOR gates as shown in FIG. 2, but the storage nodes X and Y are precharged to (1, 1) rather than to (0, 0). It is likewise conceivable for the memory element SE to operate in a storage mode when there is a high level at the control line PS and in a precharge mode on a low level is applied to the control line PS, in a similar manner to the realization with NAND gates as shown in FIG. 3, but precharge is effected to (0, 0) rather than to (1, 1).

Figure 1:
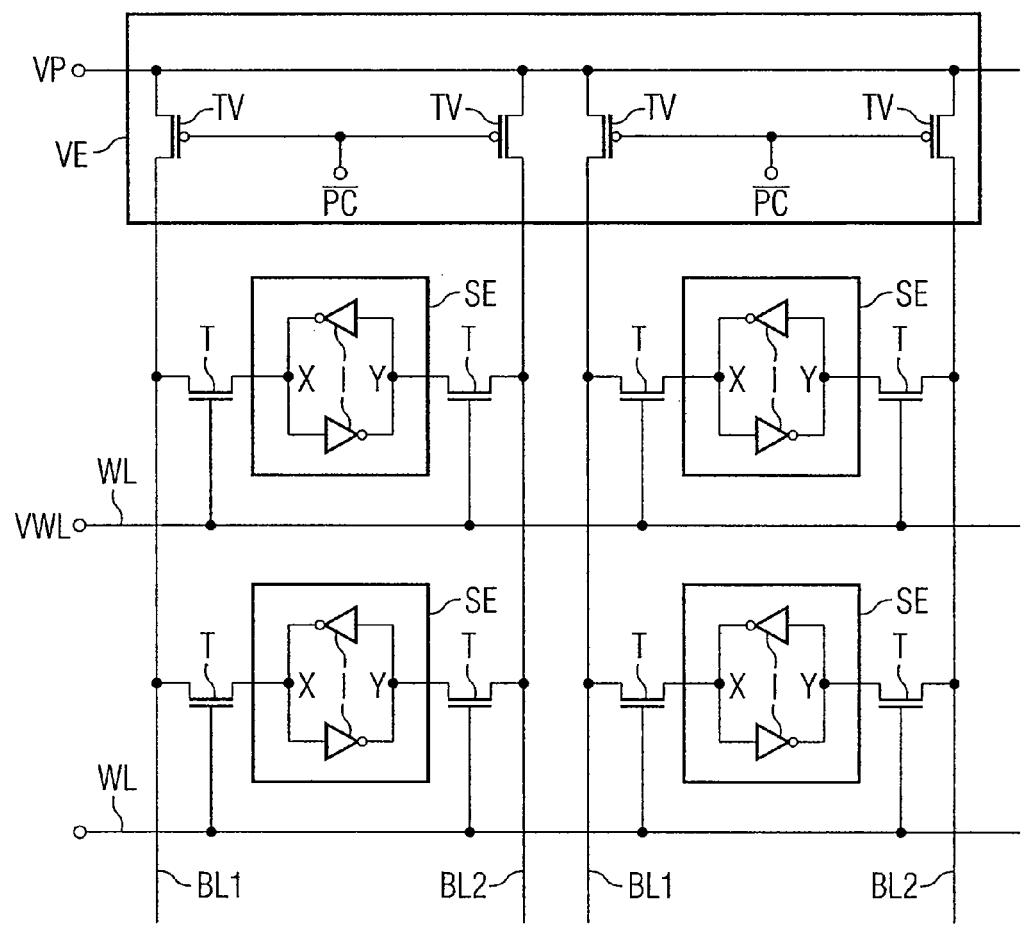
FIG. 1 shows a detail from a cell array of a conventional SRAM.

The precharge unit VE from FIG. 1 is not shown in FIGS. 2 and 3. However, a person skilled in the art would use it just the same in order to enable dual rail precharged reading operation as in FIG. 1.

The current consumption when writing to the memory element SE could be reduced in comparison with a standard SRAM cell since, when changing the logic state, on account of precharge, it is not necessary to effect driving relative to both feedback inverters.

With the precharging of the storage nodes X and Y, it is additionally possible for the information stored in the memory element SE to be immediately erased without necessitating a selection of the memory element SE by means of the bit lines BL1 and BL2 and by means of the word line WL. Since it is thus possible, without addressing, for a large number of memory elements SE to be erased in parallel by application of a suitable level to the operating line PS, a memory constructed with the memory elements SE according to the invention can be rapidly erased as reaction to a detected attack and thus prevent the covert observation of confidential information.

What is claimed is:

1. A memory element comprising:
  a first logic component having a first input, a second input, and an output; and
  a second logic component having a first input, a second input, and an output,
  wherein the first input of the first logic component is connected to the output of the second logic component, the first input of the second logic component is connected to the output of the first logic component, the second input of the first logic component and the second input of the second logic component are connected to a control line, and
  wherein the first logic component and the second logic component are embodied such that when a control signal having a first level is applied to the control line, at the respective output, a signal is output which has an output level that is inverted with respect to the level of the signal present at the respective first input, and
  when a control signal having a second level is applied to the control line, at the respective output a signal is output which has a predetermined level independent of the level of the signal present at the respective first input.

2. The memory element as claimed in claim 1, wherein when a control signal having a second level is present at the control line, the predetermined level corresponds to the first level.

3. The memory element as claimed in claim 2, wherein the first level is complementary to the second level.

4. The memory element as claimed in claim 3, wherein the first logic component and the second logic component are NOR gates.

5. The memory element as claimed in claim 4, wherein the first level is a low level and the second level is a high level.

6. The memory element as claimed in claim 3, wherein the first logic component and the second logic component are NAND gates.

7. The memory element as claimed in claim 6, wherein the first level is a high level and the second level is a low level.

8. An SRAM comprising:
  an array of memory elements as claimed in claim 7;
  means for precharging the output of the first logic component and the output of the second logic component to a predetermined level; and
  means for storing information in the memory elements.

9. The memory element as claimed in claim 1, wherein when a control signal having a second level is present at the control line, the predetermined level corresponds to the second level.

10. The memory element as claimed in claim 9, wherein the first level is complementary to the second level.

11. The memory element as claimed in claim 1, wherein
  the first input of the first logic component and the output of the second logic component are connected to a first bit line via a first selection transistor,
  the first input of the second logic component and the output of the first logic component are connected to a second bit line via a second selection transistor, and
  the control input of the first selection transistor and the control input of the second selection transistor are connected to a word line.

12. A method for storing information in a memory element as claimed in claim 11, comprising:
  precharging the output of the first logic component and the output of the second logic component to a predetermined level; and
  storing information in the memory element.

13. The method as claimed in claim 12, wherein the step of precharging the outputs comprises applying a signal having a second level to the control line.

14. The method as claimed in claim 13, wherein the step of storing information comprises:
  applying a signal having a write level to the first bit line and applying a signal having a complementary level with respect to the write level to the second bit line, the write level and the complementary level with respect thereto corresponding to the information to be stored in the memory element;
  applying a signal having a first level to the control line; and applying a signal having a word line potential to the word line.

15. The method as claimed in claim 14, wherein the application of a signal having a first level to the control line and the application of a signal having a word line potential to the word line are effected simultaneously.

16. The method as claimed in claim 14, wherein the word line potential is chosen such that the first input of the first logic component and the output of the second logic component are connected to the first bit line via the first selection transistor and the first input of the second logic component and the output of the first logic component are connected to the second bit line via the second selection transistor.

17. The method as claimed in claim 16, wherein the first level is complementary to the second level.

18. The method as claimed in claim 17, wherein if the first logic component and the second logic component are NOR gates, the first level is a low level, and the second level is a high level.

19. The method as claimed in claim 17, wherein if the first logic component and the second logic component are NAND gates, the first level is a high level, and the second level is a low level.

20. An SRAM having a plurality of memory elements as claimed in claim 1 arranged in an array.

21. A memory element comprising:
a first logic means having a first input, a second input, and an output; and
a second logic means having a first input, a second input, and an output,
wherein the first input of the first logic means is connected to the output of the second logic means, the first input of the second logic means is connected to the output of the first logic means, and the second input of the first logic means and the second input of the second logic means are connected to a control line, and
wherein the first logic means and the second logic means are embodied such that
when a control signal having a first level is applied to the control line, at the respective output, a signal is output which has an output level that is inverted with respect to the level of the signal present at the respective first input, and
when a control signal having a second level is applied to the control line, at the respective output a signal is output which has a predetermined level independent of the level of the signal present at the respective first input.

* * * * *